(12) United States Patent
Ogasahara et al.

(10) Patent No.: US 8,896,744 B2
(45) Date of Patent: Nov. 25, 2014

(54) SOLID-STATE IMAGING DEVICE AND CAMERA MODULE WITH IR FILTER HAVING WAVELENGTH CHARACTERISTICS TO BLOCK BOTH IR AND SELECTED VISIBLE LIGHT BAND DEPENDING ON DETECTION TARGET OF PIXEL CELLS

(75) Inventors: Takayuki Ogasahara, Kanagawa (JP); Risako Ueno, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 13/419,671

(22) Filed: Mar. 14, 2012

(65) Prior Publication Data
US 2012/0236190 A1  Sep. 20, 2012

(30) Foreign Application Priority Data

Mar. 16, 2011 (JP) .................. 2011-057481
Jun. 27, 2011 (JP) .................. 2011-141717

(51) Int. Cl.
*H04N 5/225* (2006.01)
*H04N 9/083* (2006.01)
*H04N 3/14* (2006.01)
*H04N 5/335* (2011.01)
*H04N 9/04* (2006.01)
*H04N 5/33* (2006.01)
*G02B 3/00* (2006.01)
*G02B 5/20* (2006.01)
*H01L 27/146* (2006.01)

(52) U.S. Cl.
CPC ..... *H01L 27/14627* (2013.01); *H01L 27/14685* (2013.01); *G02B 3/0056* (2013.01); *G02B 5/201* (2013.01); *G02B 5/208* (2013.01); *H01L 27/14621* (2013.01); *H04N 9/045* (2013.01)
USPC ........... 348/342; 348/277; 348/164; 348/374

(58) Field of Classification Search
CPC .... H01L 27/14621; G02B 5/20; G02B 27/46; G02B 5/3083; H04N 5/2254; H04N 9/045
USPC .......... 348/273–280, 164, 336–340, 374, 348/E3.01, E5.09
See application file for complete search history.

(56) References Cited

U.S. PATENT DOCUMENTS 7,663,668 B2    2/2010 Kuno et al.
7,868,936 B2 *  1/2011 Ajito et al. .................. 348/271
(Continued)

FOREIGN PATENT DOCUMENTS

CN    101094320 A    12/2007
CN    101577287 A    11/2009
(Continued)

OTHER PUBLICATIONS

Office Action issued on Jun. 21, 2013 in the corresponding Korean Patent Application No. 10-2012-21917 (with English Translation).

(Continued)

*Primary Examiner* — Sinh Tran
*Assistant Examiner* — Shahbaz Nazrul
(74) *Attorney, Agent, or Firm* — Oblon, Spivak, McClelland, Maier & Neustadt, L.L.P.

(57) ABSTRACT

According to one embodiment, a solid-state imaging device includes a pixel array and an infrared light eliminating portion. The pixel array has a plurality of pixel cells arranged as being array-shaped. The pixel array detects a signal level of each color light as being shared for each pixel cell. The infrared light eliminating portion eliminates infrared light from light proceeding toward a photoelectric conversion element. The infrared light eliminating portion is arranged for each pixel cell. The infrared light eliminating portion has selection wavelength being set in accordance with color light to be a detection target of the pixel cell.

11 Claims, 10 Drawing Sheets

(56) References Cited

U.S. PATENT DOCUMENTS

| | | | |
|---|---|---|---|
| 8,035,069 B2* | 10/2011 | Toda et al. | 250/208.1 |
| 8,436,308 B2 | 5/2013 | Choe et al. | |
| 2005/0068433 A1* | 3/2005 | Aotsuka | 348/272 |
| 2007/0183657 A1* | 8/2007 | Kidono et al. | 382/162 |
| 2007/0291982 A1 | 12/2007 | Sung et al. | |
| 2008/0278592 A1 | 11/2008 | Kuno et al. | |
| 2009/0147101 A1* | 6/2009 | Tatani et al. | 348/224.1 |
| 2009/0278048 A1 | 11/2009 | Choe et al. | |
| 2011/0019004 A1* | 1/2011 | Ohmori et al. | 348/164 |
| 2013/0027701 A1* | 1/2013 | Priore et al. | 356/326 |
| 2013/0188057 A1* | 7/2013 | Lin | 348/164 |

FOREIGN PATENT DOCUMENTS

| | | |
|---|---|---|
| JP | 2005-019958 A | 1/2005 |
| JP | 2006-5500 | 1/2006 |
| JP | 2008-288851 | 11/2008 |
| JP | 2008-306379 | 12/2008 |
| JP | 2009-89158 | 4/2009 |
| JP | 2010-161636 | 7/2010 |
| JP | 2010-171861 | 8/2010 |
| JP | 2010-206678 | 9/2010 |
| JP | 2010-256633 A | 11/2010 |
| JP | 2011-29810 | 2/2011 |
| KR | 10-2006-0077089 A | 7/2006 |
| TW | 200539690 A | 12/2005 |

OTHER PUBLICATIONS

Combined Office Action and Search Report issued 17, 2014, in Taiwanese Patent Application No. 101106977 (with English translation and English translation of category of cited documents).

Chinese Office Action issued Feb. 26, 2014, in China Patent Application No. 201210055899.8 (with English translation).

Combined Office Action and Search Report issued Jan. 17, 2014, in Taiwanese Patent Application No. 101106977 (with English translation and English translation of category of cited documents).

Office Action issued Aug. 5, 2014 in Japanese Patent Application No. 2011-141717 filed Jun. 27, 2011 (with English Translation).

* cited by examiner

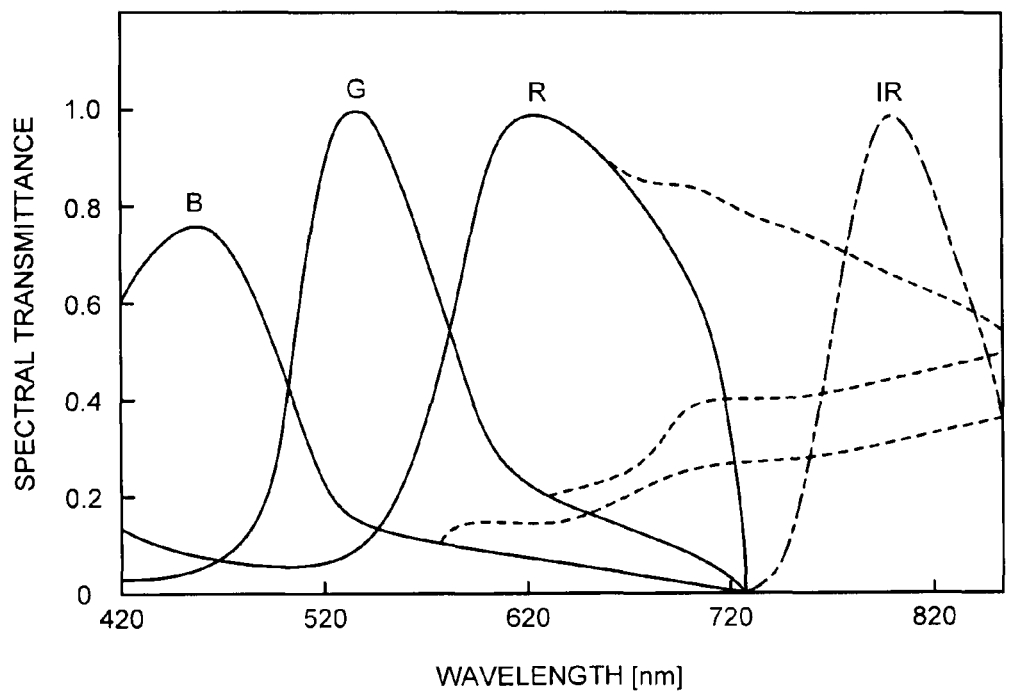

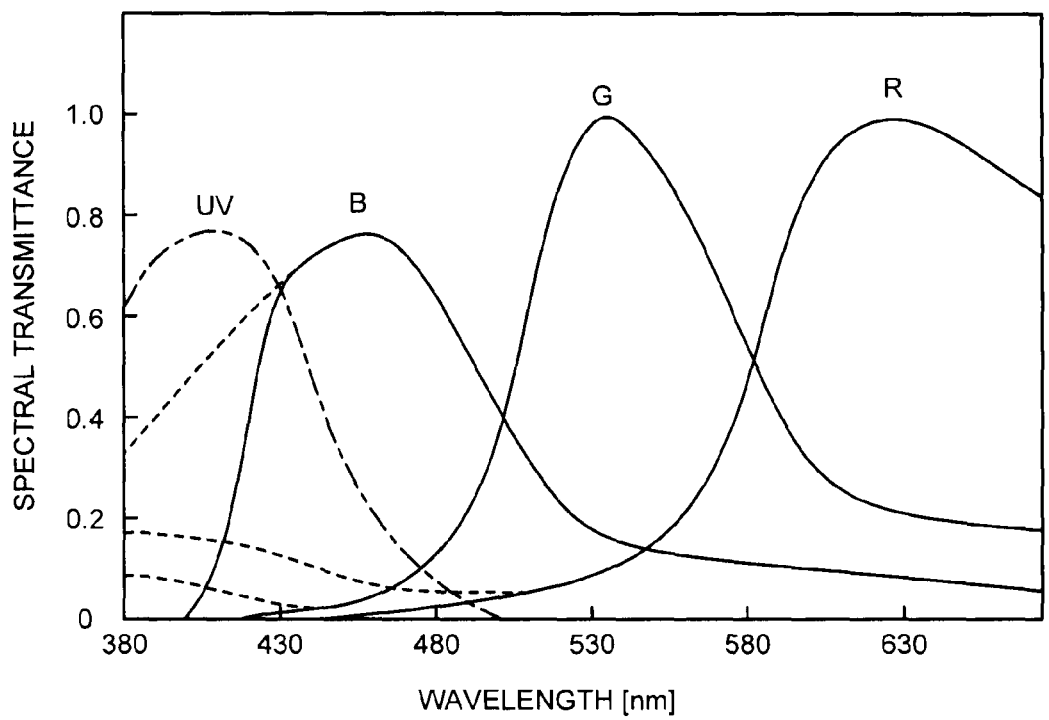

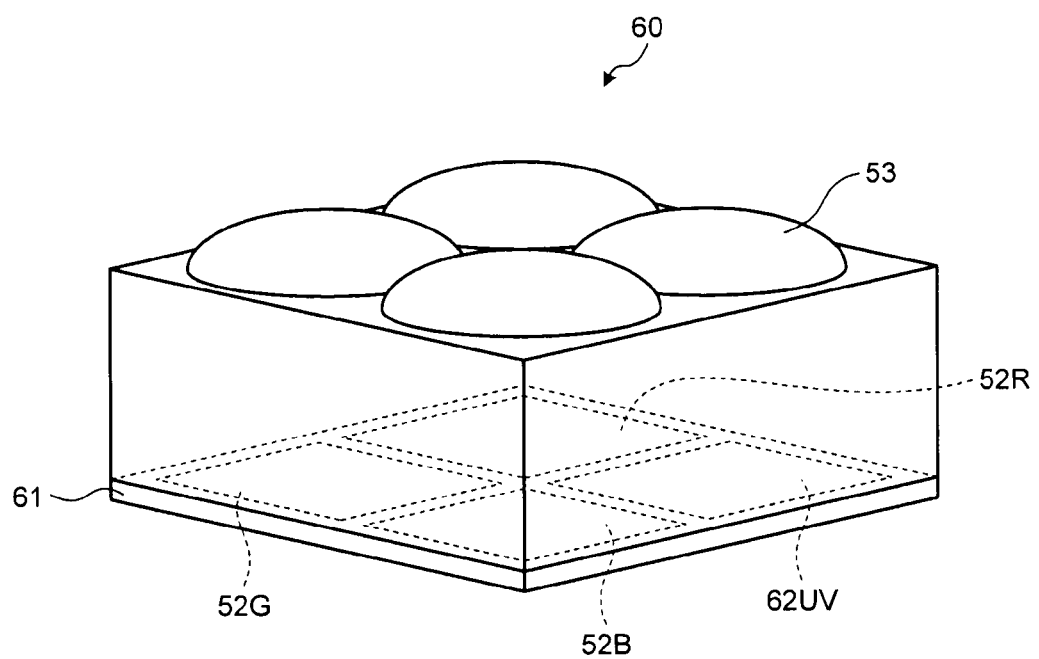

SOLID-STATE IMAGING DEVICE AND CAMERA MODULE WITH IR FILTER HAVING WAVELENGTH CHARACTERISTICS TO BLOCK BOTH IR AND SELECTED VISIBLE LIGHT BAND DEPENDING ON DETECTION TARGET OF PIXEL CELLS

CROSS-REFERENCE TO RELATED APPLICATIONS

This application is based upon and claims the benefit of priority from Japanese Patent Application No. 2011-057481, filed on Mar. 16, 2011; and No. 2011-141717, filed on Jun. 27, 2011; the entire contents of all of which are incorporated herein by reference.

FIELD

Embodiments described herein relate generally to a solid-state imaging device and a camera module.

BACKGROUND

In a conventional camera module, an infrared light (IR) cut filter has been employed to eliminate infrared light while transmitting visible light. Normally, a photoelectric conversion element to be utilized for a pixel cell of an image sensor is sensible in a near-infrared wavelength range as well. A camera module suppresses worsening of color reproducibility by eliminating near-infrared light with an IR cut filter.

In the related art, an IR cut filter has wavelength characteristics as being common for all pixel cells among pixel arrays detecting signal levels of respective colors such as red (R), green (G) and blue (B) for each pixel cell in a shared manner. When the upper limit of a transparent wavelength range of the IR cut filter is set to the short wavelength side, sensitivity for color light at the long wavelength side is decreased while worsening of color reproducibility due to unnecessary absorption components can be suppressed as reducing light which cannot be eliminated among color light at the short wavelength side. When the upper limit of the transparent wavelength range of the IR cut filter is set to the long wavelength side, worsening of color reproducibility due to increase of unnecessary absorption components is caused with color light at the short wavelength side while sensitivity for color light at the long wavelength side is remarkably increased.

BRIEF DESCRIPTION OF THE DRAWINGS

FIG. 10 is an explanatory view for spectral characteristics of respective pixel cells;

FIG. 11 is a view illustrating an example of pixels referring to signal values of acquired color components for generating a signal value of a deficient color component;

FIG. 14 is an explanatory view for arrangement of pixel cells in an image sensor being a solid-state imaging device according to a fifth embodiment;

FIG. 15 is an explanatory view for spectral characteristics of respective pixel cells;

FIG. 16 is a view illustrating an example of pixels referring to signal values of acquired color components for generating a signal value of a deficient color component;

FIG. 17 is a schematic perspective view of a camera module according to a modified example of the fifth embodiment.

DETAILED DESCRIPTION

In general, according to one embodiment, a solid-state imaging device includes a pixel array and an infrared light eliminating portion. The pixel array has a plurality of pixel cells arranged as being array-shaped. The pixel cell has a photoelectric conversion element. The pixel array detects a signal level of each color light as being shared for each pixel cell. The infrared light eliminating portion eliminates infrared light from light proceeding toward the photoelectric conversion element. The infrared light eliminating portion is arranged at each pixel cell. The infrared light eliminating portion has selection wavelength being set in accordance with color light to be a detection target of the pixel cell.

Exemplary embodiments of a solid-state imaging device and a camera module will be explained below in detail with reference to the accompanying drawings. The present invention is not limited to the following embodiments.

Figure 1:
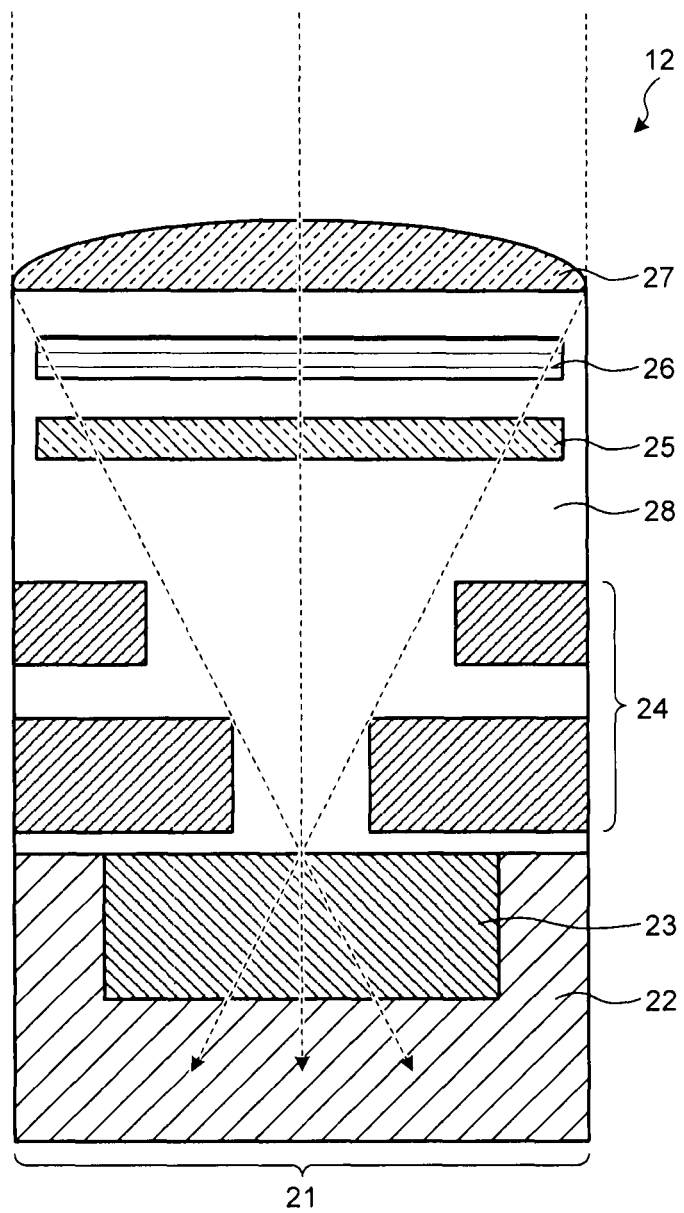
FIG. 1 is a schematic view illustrating a general structure of an image sensor being a solid-state imaging device according to a first embodiment.
Figure 2:
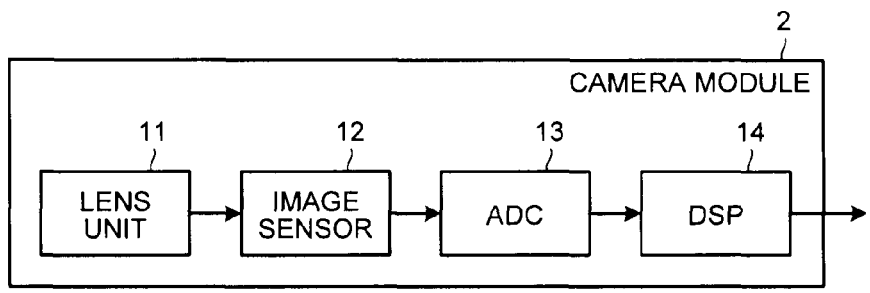
FIG. 2 is a block diagram illustrating a general structure of a camera module which includes the image sensor illustrated in FIG. 1.
Figure 3:
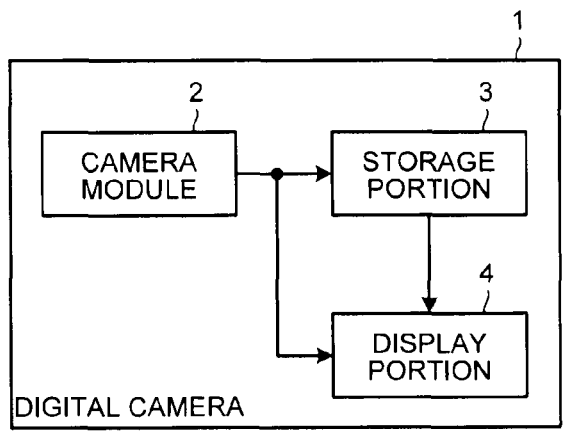
FIG. 3 is a block diagram illustrating a structure of a digital camera being an electronic device which includes the camera module illustrated in FIG. 2.

FIG. 1 is a schematic view illustrating a general structure of an image sensor being a solid-state imaging device according to the first embodiment. FIG. 2 is a block diagram illustrating a general structure of a camera module which includes the image sensor illustrated in FIG. 1. FIG. 3 is a block diagram illustrating a structure of a digital camera being an electronic device which includes the camera module illustrated in FIG. 2.

A digital camera 1 includes a camera module 2, a storage portion 3 and a display portion 4. The camera module 2 takes an object image. The storage portion 3 stores the image taken by the camera module 2. The display portion 4 displays the image taken by the camera module 2. For example, the display portion 4 is a liquid crystal display.

The camera module 2 outputs an image signal to the storage portion 3 and the display portion 4 with imaging of the object image. The storage portion 3 outputs the image signal to the display portion 4 as a function of user operation and the like. The display portion 4 displays an image in accordance with the image signal input from the camera module 2 or the storage portion 3.

An electronic device to which the camera module 2 is applied may be a device other than the digital camera 1 such as a camera-equipped portable terminal, for example.

The camera module 2 includes a lens unit 11, an image sensor 12, an analog to digital converter (ADC) 13 and a digital signal processor (DSP) 14. The lens unit 11 introduces light from an object and forms an image of the object at the image sensor 12.

The image sensor 12 captures the object image as converting light introduced by the lens unit 11 into signal charges. The image sensor 12 includes a plurality of pixel cells 21 arranged as being array-shaped. FIG. 1 illustrates a cross-sectional structure of one pixel cell 21 and elements layered on the pixel cell 21.

The pixel cell 21 includes a photoelectric conversion element 23 and a detection portion (not illustrated). The photoelectric conversion element 23 is structured with a part of an impurity diffused area which is formed at a surface of a semiconductor substrate 22. The photoelectric conversion element 23 generates charges corresponding to an incident light amount. The detection portion converts signal charges from the photoelectric conversion element 23 into voltage. The pixel cells 21 for respective color light is arranged as a pixel array in accordance with predetermined color arrangement such as Bayer arrangement.

A wiring portion 24, a color filter 25, an IR cut filter 26 and a micro lens 27 are layered on the pixel cell 21 respectively via a protection layer 28. The wiring portion 24 is used for charge transferring from the pixel cell 21 and light shielding.

The color filter 25 and the IR cut filter 26 are disposed to a light path between the micro lens 27 and the photoelectric conversion element 23. The color filter 25 is arranged for each pixel cell 21 in accordance with color light being a detection target of the pixel cell 21. The color filter 25 transmits the color light being the detection target of the pixel cell 21 selectively among light proceeding toward the photoelectric conversion element 23.

The color filter 25 arranged at the pixel cell 21 which detects red light (R-light) transmits R-light and blocks green light (G-light) and blue light (B-light). The color filter 25 arranged at the pixel cell 21 which detects G-light transmits G-light and blocks R-light and B-light. The color filter 25 arranged at the pixel cell 21 which detects B-light transmits B-light and blocks R-light and G-light.

The IR cut filter 26 is arranged for each pixel cell 21. The IR cut filter 26 eliminates infrared light from light proceeding toward the photoelectric conversion element 23. The micro lens 27 is arranged for each pixel cell 21. The micro lens 27 collects light proceeding toward the photoelectric conversion element 23. It is also possible to integrate the color filter 25 and the IR cut filter 26.

The image sensor 12 generates an analog image signal by taking signal values of R, G and B in an order corresponding to Bayer arrangement. The ADC 13 converts the image signal of the image sensor 12 from an analog system into a digital system. The DSP 14 performs a variety of image processing on the digital image signal from the ADC 13.

Since the IR cut filter 26 is disposed to the light path between the micro lens 27 and the photoelectric conversion element 23 in the image sensor 12, the camera module 2 can have the lens unit 11 which is structured simpler compared to a case of disposing the IR cut filter 26 to the lens unit 11, for example. Here, it is also possible to dispose the IR cut filter 26 in the image sensor 12 at the lens unit 11 side against the micro lens 27.

Figure 4:
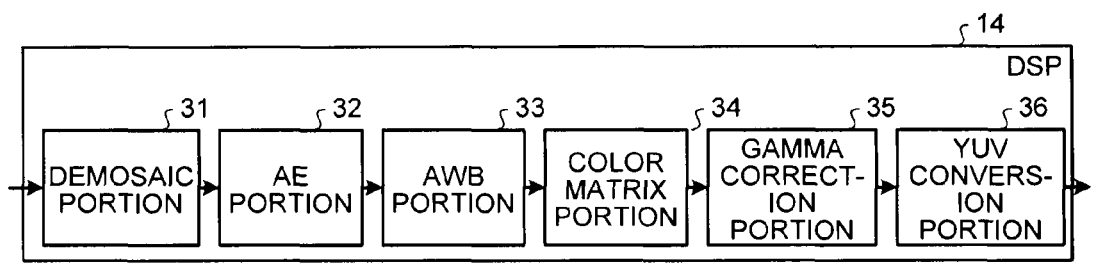
FIG. 4 is a block diagram illustrating a structure of a DSP.

FIG. 4 is a block diagram illustrating a structure of the DSP. The DSP 14 includes a demosaic portion 31, an auto exposure (AE) portion 32, an auto white balance (AWB) portion 33, a color matrix portion 34, a gamma correction portion 35 and a YUV conversion portion 36.

The demosaic portion 31 generates a signal (i.e., a sensitivity signal) of RGB with an interpolation process (i.e., a demosaic process) of the digital image signal transmitted in the order of Bayer arrangement. The AE portion 32 performs AE adjustment of the RGB sensitivity signal. The AWB portion 33 performs AWB adjustment of the RGB sensitivity signal.

The color matrix portion 34 performs a color matrix arithmetic processing (i.e., a color reproducibility processing) to obtain color reproducibility on the RGB sensitivity signal. The gamma correction portion 35 performs gamma correction to correct an image tone on the RGB sensitivity signal. The YUV conversion portion 36 converts the image signal from an RGB system into a YUV system (e.g., YUV422 and the like) by generating a luminance (Y) signal and a color difference (UV) signal from the RGB sensitivity signal.

The IR cut filter 26 is a photonic color filter in which layers having mutually different refraction indexes are laminated in a cyclic manner, for example. In the IR cut filter 26, thickness of at least one layer in the lamination structure is differentiated for each color light. The IR cut filter 26 has difference in wavelength for selective transmission in accordance with color light being the detection target of the pixel cell 21.

For example, the IR cut filter 26 is structured by laminating inorganic material such as $SiO_2$ and $TiO_2$. For example, the IR cut filter 26 is manufactured with a vacuum film-forming method such as spattering and vacuum deposition. It is possible to form the IR cut filter 26 of which wavelength characteristics are differentiated for each pixel cell 21 by utilizing inorganic material.

Figure 5:
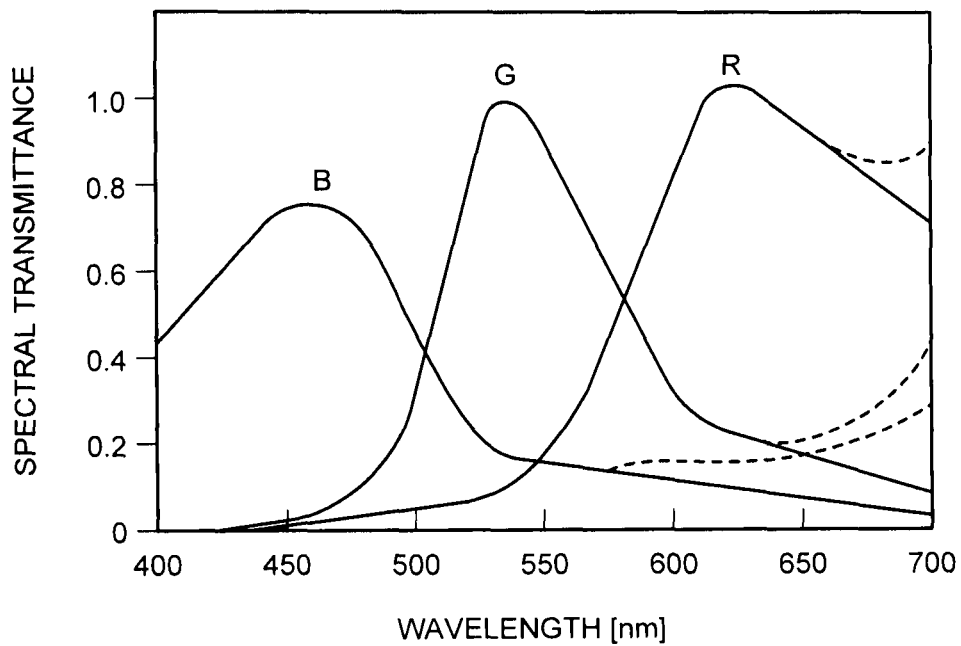
FIG. 5 is an explanatory view for spectral characteristics of a color filter and an IR cut filter.

FIG. 5 is an explanatory view for spectral characteristics of the color filter and the IR cut filter. In FIG. 5, the vertical axis denotes spectral transmittance and the horizontal axis denotes wavelength. Each wavelength in the following description is described as an example and can be modified appropriately.

The spectral transmittance of the color filter 25 for B-light is maximized at the vicinity of 450 nm. The spectral transmittance is gradually decreased with wavelength lengthening from the vicinity of 450 nm. The spectral transmittance is slightly increased with wavelength lengthening from the vicinity of 570 nm as illustrated by a broken line in the drawing.

The spectral transmittance of the color filter 25 for G-light is maximized at the vicinity of 540 nm. The spectral transmittance is gradually decreased with wavelength lengthening from the vicinity of 540 nm. The spectral transmittance is slightly increased with wavelength lengthening from the vicinity of 640 nm as illustrated by a broken line in the drawing.

The spectral transmittance of the color filter 25 for R-light is maximized at the vicinity of 630 nm. The spectral transmittance is gradually decreased with wavelength lengthening from the vicinity of 630 nm. The spectral transmittance is slightly increased with wavelength lengthening from the vicinity of 660 nm as illustrated by a broken line in the drawing.

The image sensor 12 causes worsening of color reproducibility when light which cannot be eliminated by each color filter 25 is taken into the pixel cell 21 as an unnecessary absorption component along with color light being the primary detection target.

The IR cut filter 26 has a wavelength characteristic to block light in a wavelength range where spectral transmittance of the color filter 25 is increased with wavelength lengthening among a range at the side where wavelength is longer than the wavelength having the maximum spectral transmittance of the color filter 25 for color light being the detection target of the pixel cell 21.

The IR cut filter 26 corresponding to the pixel cell 21 of which detection target is B-light has a wavelength characteristic set to block light of which wavelength is at the longer side than the vicinity of 570 nm. The spectral transmittance is gradually decreased as illustrated by a solid line in the drawing at the longer wavelength side than the vicinity of 570 nm by combining the IR cut filter 26 with the color filter 25 for B-light.

The IR cut filter 26 corresponding to the pixel cell 21 of which detection target is G-light has a wavelength characteristic set to block light of which wavelength is at the longer side than the vicinity of 640 nm. The spectral transmittance is gradually decreased as illustrated by a solid line in the drawing at the longer wavelength side than the vicinity of 640 nm by combining the IR cut filter 26 with the color filter 25 for G-light.

The IR cut filter 26 corresponding to the pixel cell 21 of which detection target is R-light has a wavelength characteristic set to block light of which wavelength is at the longer side than the vicinity of 660 nm. The spectral transmittance is gradually decreased as illustrated by a solid line in the drawing at the longer wavelength side than the vicinity of 660 nm by combining the IR cut filter 26 with the color filter 25 for R-light.

In this manner, the IR cut filter 26 is set to have selection wavelength corresponding to color light being the detection target of the pixel cell 21. By applying the IR cut filter 26 of which selection wavelength is differentiated in accordance with color light, the image sensor 12 can eliminate unnecessary absorption components at the pixel cell 21 more effectively compared to a case of utilizing a conventional filter of which wavelength characteristics are evened against the entire image sensor 12. Accordingly, the image sensor 12 can suppress worsening of color reproducibility.

Since the unnecessary absorption components can be reduced, the camera module 2 can lessen a coefficient of color matrix arithmetic at the color matrix portion 34. Since a gain can be lessened by lessening the coefficient of the color matrix arithmetic, the camera module 2 can provide an image of which noise is reduced.

Here, the image sensor 12 is not limited to a structure to mutually differentiate selection wavelength of the IR cut filter 26 for all color light. The image sensor 12 is simply required such that selection wavelength of the IR cut filter 26 corresponding to at least one color light is different from that of IR cut filters 26 corresponding to other color light.

For example, it is also possible that the IR cut filter 26 on the pixel cell 21 of which detection target is G-light and the IR cut filter 26 on the pixel cell 21 of which detection target is B-light have common wavelength respectively as the upper limit of the transparent wavelength as being the vicinity of 620 nm and the like, for example. There is a case that unnecessary components of the pixel cell 21 of which detection target is R-light can be reduced than that of the pixel cell 21 of which detection target is other color light. Accordingly, it is also possible that the IR cut filter 26 on the pixel cell 21 of which detection target is R-light has the upper limit of the transparent wavelength being at the longer wavelength side than a visible range, for example.

Figure 6:
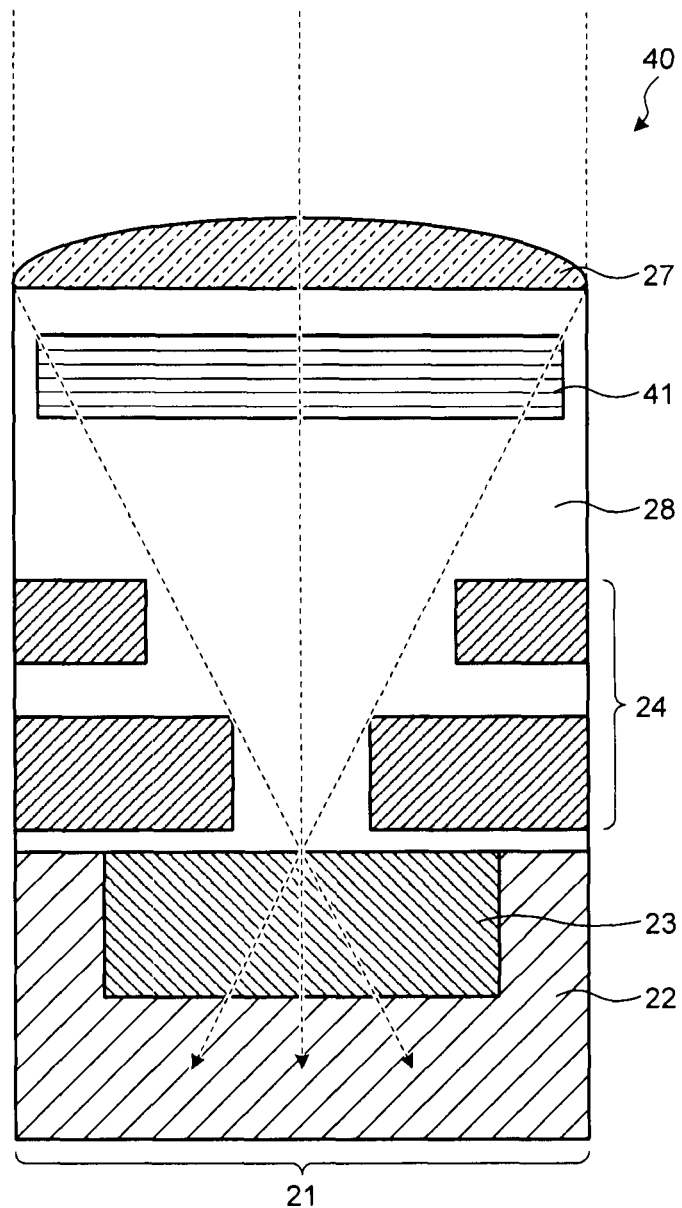
FIG. 6 is a schematic view illustrating a general structure of an image sensor being a solid-state imaging device according to a second embodiment.

FIG. 6 is a schematic view illustrating a general structure of an image sensor being a solid-state imaging device according to a second embodiment. An image sensor 40 according to the present embodiment is applied to the camera module 2 (see FIG. 2). The same numeral is given to the same part as the first embodiment and duplicative description is skipped.

The image sensor 40 includes a plurality of pixel cells 21 arranged as being array-shaped. FIG. 6 illustrates a cross-sectional structure of one pixel cell 21 and elements layered on the pixel cell 21.

The image sensor 40 includes a photonic color filter 41 which is disposed to a light path between the micro lens 27 and the photoelectric conversion element 23. The photonic color filter 41 is arranged for each pixel cell 21 in accordance with color light being the detection target of the pixel cell 21. The photonic color filter 41 selectively transmits the color light being the detection target of the pixel cell 21 and eliminates infrared light among light proceeding toward the photoelectric conversion element 23.

The photonic color filter 41 is arranged instead of the color filter 25 and the IR cut filter 26 (see FIG. 1) in the first embodiment. The photonic color filter 41 combines functions of the color filter 25 and the IR cut filter 26. The photonic color filter 41 corresponds to integration of the color filter 25 and the IR cut filter 26. Here, it is also possible to integrate the photonic color filter 41 with the micro lens 27.

Figure 7:
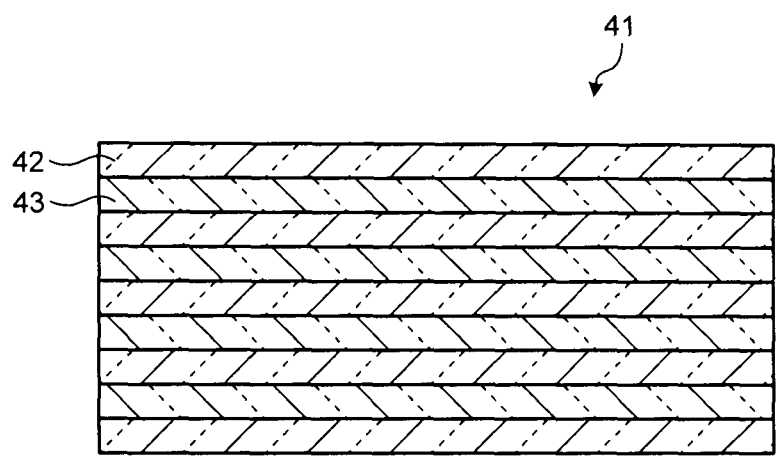
FIG. 7 is a schematic cross-sectional view of a photonic color filter.

FIG. 7 is a schematic cross-sectional view of the photonic color filter. The photonic color filter 41 has a lamination structure in which layers having mutually different refraction indexes are laminated in a cyclic manner. The photonic color filter 41 has a structure in which two kinds of dielectric layers being a high refraction index layer 42 and a low refraction index layer 43 are alternately laminated.

In the photonic color filter 41, at least either the high refraction index layer 42 or the low refraction index layer 43 is formed to have different thickness for each color light. The photonic color filter 41 has difference in wavelength for selective transmission in accordance with color light being the detection target of the pixel cell 21.

The high refraction index layer 42 is formed of inorganic material such as $TiO_2$. The low refraction index layer 43 is formed of inorganic material such as $SiO_2$. For example, the photonic color filter 41 is manufactured with a vacuum film-forming method such as spattering and vacuum deposition. It is possible to form the photonic color filter 41 of which wavelength characteristics are differentiated for each pixel cell 21 by utilizing inorganic material.

Since the unnecessary components at the pixel cell 21 can be effectively eliminated as being similar to the first embodiment, the image sensor 40 according to the second embodiment can suppress worsening of color reproducibility. Since the photonic color filter 41 is disposed to the light path between the micro lens 27 and the photoelectric conversion element 23 in the image sensor 40, the camera module 2 can have the lens unit 11 which is structured simpler compared to a case of disposing the IR cut filter to the lens unit 11, for example.

Since the photonic color filter 41 which combines the function of the color filter 25 and the function of the IR cut filter 26 is applied, the image sensor 40 can have a simple structure as reducing part count.

Figure 8:
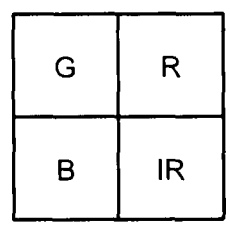
FIG. 8 is an explanatory view for arrangement of pixel cells in an image sensor being a solid-state imaging device according to a third embodiment.

FIG. 8 is an explanatory view for arrangement of pixel cells in an image sensor being a solid-state imaging device according to a third embodiment. The image sensor of the present embodiment is applied to the camera module 2 (see FIG. 2).

Figure 9:
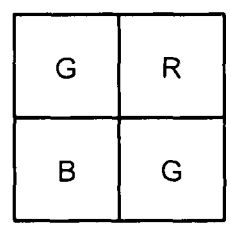
FIG. 9 is an explanatory view for Bayer arrangement.

FIG. 9 is an explanatory view for Bayer arrangement. In Bayer arrangement illustrated in FIG. 9, an R-pixel and a B-pixel are arranged at opposing corners of a 2×2 matrix pixel block and two G-pixels are arranged at the remaining opposing corners.

As illustrated in FIG. 8, the image sensor of the third embodiment has a structure in which one of the two G-pixels is replaced with an infrared (IR) pixel in the 2×2 matrix pixel block which structures Bayer arrangement. The image sensor of the present embodiment acquires information of infrared light in addition to information of three colors of RGB with four pixels as one set. The camera module 2 enables to perform image processing utilizing the information of infrared light.

The image sensor includes an R-pixel cell which detects R-light, a G-pixel cell which detects G-light, a B-pixel cell which detects B-light, and an IR-pixel cell which detects infrared light. The R-pixel cell, the G-pixel cell and the B-pixel cell are pixel cells for visible light to detect signal levels of RGB being visible light in a shared manner. In the third embodiment, the pixel cells for visible light are formed similarly to the pixel cells for the respective color light of the first embodiment, for example.

The IR-pixel cell is provided with an IR transmission filter instead of the color filter 25 and the IR cut filter 26 (see FIG. 1) in the pixel cell for each color light. The IR transmission filter transmits infrared light and blocks light of the respective colors of RGB.

Similarly to the IR cut filter 26 of the pixel cell for visible light, the IR transmission filter is a photonic color filter, for example. The IR transmission filter has a lamination structure in which inorganic material such as $SiO_2$ and $TiO_2$ is laminated. Each layer structuring the IR transmission filter is formed to have thickness enabling to selectively transmit infrared light.

For example, the IR transmission filter is manufactured with a vacuum film-forming method such as spattering and vacuum deposition. Here, similarly to the pixel cell for each color light of the second embodiment, the pixel cell for visible light of the third embodiment may be structured to have the photonic color filter 41 (see FIG. 6).

FIG. 10 is an explanatory view for spectral characteristics of the respective pixel cells. Each wavelength in the following description is described as an example and can be modified appropriately. Spectral characteristics due to combination of the color filter 25 and the IR cut filter 26 or spectral characteristics due to photonic color filter 41 are indicated for the pixel cells for visible light. Spectral characteristics due to the IR transmission filter are indicated for the IR-pixel cell.

In the pixel cells for visible light, the color filter 25 and the IR cut filter 26 or the photonic color filter 41 has a wavelength characteristic to block light in a range of wavelength to be transmitted by the IR transmission filter.

Similarly to the first embodiment, the B-pixel cell gradually decreases the spectral transmittance as illustrated by a solid line in the drawing with wavelength lengthening from the vicinity of 570 nm. Further, the B-pixel cell has a characteristic to be capable of completely cutting light of which wavelength is longer than either 670 nm or 730 nm (e.g., 730 nm).

Similarly to the first embodiment, the G-pixel cell gradually decreases the spectral transmittance as illustrated by a solid line in the drawing with wavelength lengthening from the vicinity of 640 nm. Further, similarly to the B-pixel cell, the G-pixel cell has a characteristic to be capable of completely cutting light of which wavelength is longer than either 670 nm or 730 nm (e.g., 730 nm).

Similarly to the first embodiment, the R-pixel cell gradually decreases the spectral transmittance as illustrated by a solid line in the drawing with wavelength lengthening from the vicinity of 660 nm. Further, similarly to the B-pixel cell and the G-pixel cell, the R-pixel cell has a characteristic to be capable of completely cutting light of which wavelength is longer than either 670 nm or 730 nm (e.g., 730 nm).

The IR transmission filter of the IR-pixel cell has a characteristic to transmit light of which wavelength is 730 nm or longer. The spectral transmittance of the IR transmission filter is maximized at the vicinity of 800 nm.

The image sensor has the IR-pixel cell arranged in the pixel array. The image sensor cuts light of which wavelength is to be the detection target of the IR-pixel cell at the pixel cells for visible light. The image sensor can acquire information of infrared light by the IR-pixel cell while acquiring information of each color light being visible light.

FIG. 11 is a view illustrating an example of pixels referring to signal values of acquired color components for generating a signal value of a deficient color component. The demosaic portion 31 (see FIG. 4) generates a signal value of a deficient color component for each pixel with an interpolating process of the signal values of the acquired color components for each pixel. The demosaic portion 31 calculates each signal value of RGB being the deficient color components for the IR-pixel.

The demosaic portion 31 refers signal values of nine pieces of pixels included in a 3×3 matrix pixel block, for example, for generating a signal value of a deficient color component. For example, the demosaic portion 31 calculates each signal value of the deficient color components at the IR-pixel cell with each equation indicated below.

(A signal value of $R$)=$(R1+R2)/2$ (A signal value of $G$)=$(G1+G2+G3+G4)/4$ (A signal value of $B$)=$(B1+B2)/2$ In each equation, terms of "R1" and "R2" respectively denote signal values of R-components detected by two R-pixels which are included in the pixel block. Terms of "G1", "G2", "G3" and "G4" respectively denote signal values of G-components detected by four G-pixels which are included in the pixel block. Terms of "B1" and "B2" respectively denote signal values of B-components detected by two B-pixels which are included in the pixel block. In the DSP 14 (see FIG. 4), the AE portion 32 performs AE adjustment having visible light components as the target. The AWB portion 33 performs AWB adjustment having the visible light components as the target.

Here, not limited to the case of performing the demosaic process with the method described in the third embodiment, the demosaic portion 31 may perform the demosaic process with any method. For example, the demosaic process can be appropriately modified to improve color reproducibility, a signal-noise ratio (i.e., an S/N ratio), resolution and the like.

When the image sensor of the third embodiment is applied, the camera module 2 can acquire information of infrared light along with information of each color light without separately adding a dedicated image sensor for detecting infrared light. Compared to a case of normal Bayer arrangement, the camera module 2 can be added with functions utilizing information of infrared light by the amount of replacing a part of G-pixels with the IR pixel in exchange for decrease of color information to be detected.

For example, the camera module 2 is to be capable of taking an image at high sensitivity under low luminance circumstances by utilizing luminance information of infrared light. It is also possible that the camera module 2 is structured as a so-called gesture recognition system by combining the image sensor of the third embodiment with an infrared light source. The gesture recognition system recognizes motion of an object by detecting infrared light which is reflected from the object.

The image sensor according to the third embodiment can suppress worsening of color reproducibility of the pixel cells for visible light by enabling to effectively eliminate unnecessary absorption components as being similar to the first embodiment.

Figure 12:
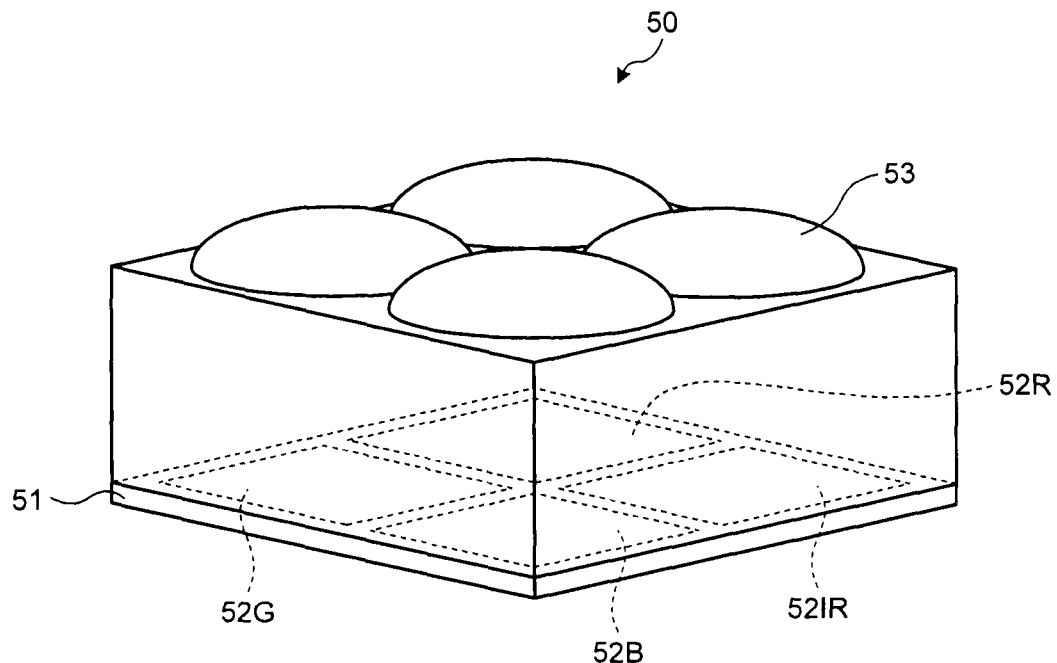
FIG. 12 is a schematic perspective view of a camera module according to a fourth embodiment.

FIG. 12 is a schematic perspective view of a camera module according to a fourth embodiment. A camera module 50 according to the present embodiment is applied to an electronic device such as the digital camera 1 (see FIG. 3).

The camera module 50 includes an image sensor 51 and four pieces of imaging lenses 53. The imaging lenses 53 structure a 2×2 lenslet. The imaging lenses 53 structure a lens unit which introduces light from an object.

Figure 13:
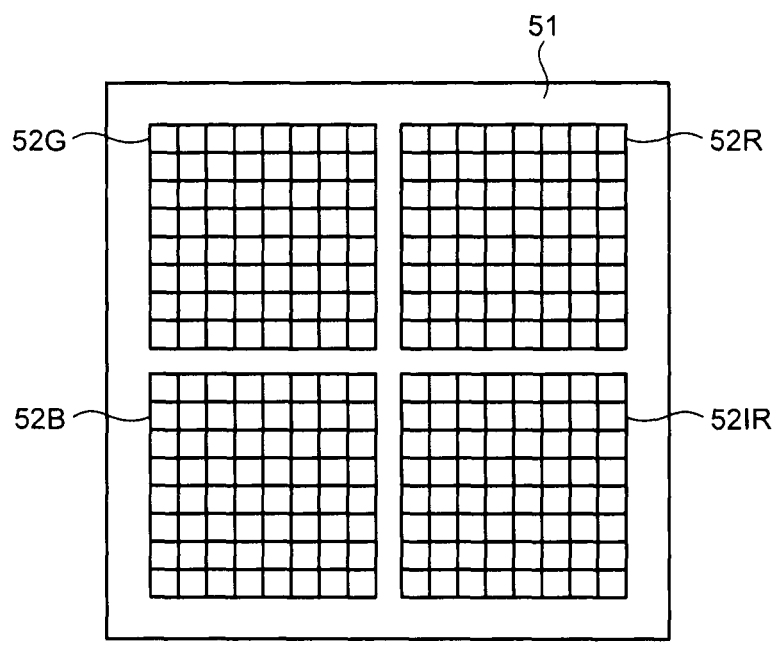
FIG. 13 is a schematic top view of an image sensor.

FIG. 13 is a schematic top view of the image sensor. The image sensor 51 includes an R-pixel array 52R, a B-pixel array 52B, a G-pixel array 52G and an IR-pixel array 52IR. Here, in the drawing, only light-receiving surfaces of the respective pixel arrays 52R, 52B, 52G and 52IR are illustrated while skipping the rest of the structure.

The R-pixel array 52R, the B-pixel array 52B and the G-pixel array 52G are pixel arrays for respective color light. The R-pixel array 52R, the B-pixel array 52B and the G-pixel array 52G are pixel arrays for respective colors having pixel cells for visible light arranged for each color component. The IR-pixel array 52IR is a pixel array in which pixel cells for infrared light are arranged.

The R-pixel array 52R includes the R-pixel cells arranged as being array-shaped. The B-pixel array 52B includes the B-pixel cells arranged as being array-shaped. The G-pixel array 52G includes the G-pixel cells arranged as being array-shaped. The IR-pixel array 52IR includes the IR-pixel cells arranged as being array-shaped. The R-pixel cell, the G-pixel cell and the B-pixel cell being pixel cells for visible light are structured similarly to the pixel cells for respective color light of the third embodiment. The IR-pixel cell is structured similarly to the IR-pixel cell of the third embodiment.

The R-pixel array 52R, the B-pixel array 52B, the G-pixel array 52G and the IR-pixel array 52IR form a matrix of two rows and two columns in the image sensor 51. The imaging lenses 53 are arranged as corresponding respectively to the R-pixel array 52R, the B-pixel array 52B, the G-pixel array 52G and the IR-pixel array 52IR.

The camera module 50 is capable of synthesizing a color image constituted with respective color components of RGB based on respective signal values taken by the pixel arrays 52R, 52B and 52G for the respective colors without performing a demosaic process. After synthesizing the color image, the camera module 50 performs a color matrix arithmetic processing, white balance adjustment and gamma correction as being similar to the first embodiment. Further, the camera module 50 can acquire information of infrared light with the IR-pixel array 52IR.

Similarly to the third embodiment, the camera module 50 having the image sensor 51 of the fourth embodiment applied can acquire information of infrared light along with information of each color light without separately adding a dedicated image sensor for detecting infrared light. The image sensor 51 according to the fourth embodiment can suppress worsening of color reproducibility of the pixel cells for visible light by enabling to effectively eliminate unnecessary absorption components as being similar to the first embodiment.

In the image sensor 51, crosstalk between pixel cells due to leakage of light of the respective color components and the infrared component can be avoided by arranging the pixel arrays for the respective color components and the pixel array for the infrared component. The image sensor 51 can remarkably improve color reproducibility and sensitivity with crosstalk suppressing. Further, the image sensor 51 can remarkably reduce axial chromatic aberration by enabling to utilize the imaging lens 53 designed to be optimized in accordance with a wavelength range of light being a detection target.

FIG. 14 is an explanatory view for arrangement of pixel cells in an image sensor being a solid-state imaging device according to a fifth embodiment. The image sensor of the present embodiment is applied to the camera module 2 (see FIG. 2).

The image sensor of the fifth embodiment has a structure in which one of the two G-pixels is replaced with an ultraviolet (UV) pixel in the 2×2 matrix pixel block which structures Bayer arrangement. The image sensor of the present embodiment acquires information of ultraviolet light in addition to information of three colors of RGB with four pixels as one set. The camera module 2 enables to perform image processing utilizing the information of ultraviolet light.

The image sensor includes an R-pixel cell which detects R-light, a G-pixel cell which detects G-light, a B-pixel cell which detects B-light, and a UV-pixel cell which detects ultraviolet light. The R-pixel cell, the G-pixel cell and the B-pixel cell are pixel cells for visible light to detect signal levels of RGB being visible light in a shared manner. In the fifth embodiment, the pixel cells for visible light are formed similarly to the pixel cells for the respective color light of the first embodiment, for example.

The UV-pixel cell is provided with a UV transmission filter instead of the color filter 25 and the IR cut filter 26 (see FIG. 1) in the pixel cell for each color light. The UV transmission filter transmits ultraviolet light and blocks light of the respective colors of RGB.

For example, the UV transmission filter is a photonic color filter. The UV transmission filter has a lamination structure in which inorganic material such as $SiO_2$ and $TiO_2$ is laminated. Each layer structuring the UV transmission filter is formed to have thickness enabling to selectively transmit ultraviolet light.

For example, the UV transmission filter is manufactured with a vacuum film-forming method such as spattering and vacuum deposition. Here, similarly to the pixel cell for each color light of the second embodiment, the pixel cell for visible light of the fifth embodiment may be structured to have the photonic color filter 41 (see FIG. 6).

FIG. 15 is an explanatory view for spectral characteristics of the respective pixel cells. Each wavelength in the following description is described as an example and can be modified appropriately. Spectral characteristics due to combination of the color filter 25 and the IR cut filter 26 or spectral characteristics due to photonic color filter 41 are indicated for the pixel cells for visible light. Spectral characteristics due to the UV transmission filter are indicated for the UV-pixel cell.

In the pixel cells for visible light, the color filter 25 and the IR cut filter 26 or the photonic color filter 41 has a wavelength characteristic to block light in a range of wavelength to be transmitted by the UV transmission filter.

Similarly to the first embodiment, the B-pixel cell gradually decreases the spectral transmittance with wavelength lengthening from the vicinity of 570 nm. Further, the B-pixel cell gradually decreases the spectral transmittance as illustrated by a solid line in the drawing with wavelength shortening from the vicinity of 430 nm. In the drawing, a broken line illustrated as being continued from the spectral characteristic for B denotes an example of the spectral characteristic of a conventionally-known color filter for B-light.

Similarly to the first embodiment, the G-pixel cell gradually decreases the spectral transmittance with wavelength lengthening from the vicinity of 640 nm. Further, the G-pixel cell gradually decreases the spectral transmittance as illustrated by a solid line in the drawing with wavelength shortening from the vicinity of 430 nm. In the drawing, a broken line illustrated as being continued from the spectral characteristic for G denotes an example of the spectral characteristic of a conventionally-known color filter for G-light.

Similarly to the first embodiment, the R-pixel cell gradually decreases the spectral transmittance with wavelength lengthening from the vicinity of 660 nm. Further, the R-pixel cell gradually decreases the spectral transmittance as illustrated by a solid line in the drawing with wavelength shortening from the vicinity of 510 nm. In the drawing, a broken line illustrated as being continued from the spectral characteristic for R denotes an example of the spectral characteristic of a conventionally-known color filter for R-light.

The UV transmission filter of the UV-pixel cell has a characteristic to transmit light of which wavelength is 510 nm or shorter. The spectral transmittance of the UV transmission filter is maximized at the vicinity of 400 nm.

The image sensor has the UV-pixel cell arranged in the pixel array. The image sensor cuts light of which wavelength is to be the detection target of the UV-pixel cell at the pixel cells for visible light. The image sensor can acquire information of ultraviolet light by the UV-pixel cell while acquiring information of each color light being visible light by the pixel cells for visible light.

FIG. 16 is a view illustrating an example of pixels referring to signal values of acquired color components for generating a signal value of a deficient color component. The demosaic portion 31 (see FIG. 4) generates a signal value of a deficient color component for each pixel with an interpolating process of the signal values of the acquired color components for each pixel. The demosaic portion 31 calculates each signal value of RGB being the deficient color components for the UV-pixel.

The demosaic portion 31 refers signal values of nine pieces of pixels included in a 3×3 matrix pixel block, for example, for generating a signal value of a deficient color component. For example, the demosaic portion 31 calculates each signal value of the deficient color components at the UV-pixel cell with each equation indicated below.

(A signal value of $R$)=$(R1+R2)/2$ (A signal value of $G$)=$(G1+G2+G3+G4)/4$ (A signal value of $B$)=$(B1+B2)/2$ In each equation, terms of "R1" and "R2" respectively denote signal values of R-components detected by two R-pixels which are included in the pixel block. Terms of "G1", "G2", "G3" and "G4" respectively denote signal values of G-components detected by four G-pixels which are included in the pixel block. Terms of "B1" and "B2" respectively denote signal values of B-components detected by two B-pixels which are included in the pixel block. In the DSP 14 (see FIG. 4), the AE portion 32 performs AE adjustment having visible light components as the target. The AWB portion 33 performs AWB adjustment having the visible light components as the target.

Not limited to the case of performing the demosaic process with the method described in the fifth embodiment, the demosaic portion 31 may perform the demosaic process with any method. For example, the demosaic process can be appropriately modified to improve color reproducibility, an S/N ratio, resolution and the like.

When the image sensor of the fifth embodiment is applied, the camera module 2 can acquire information of ultraviolet light along with information of each color light without separately adding a dedicated image sensor for detecting ultraviolet light. Compared to a case of normal Bayer arrangement, the camera module 2 can be added with functions utilizing information of ultraviolet light by the amount of replacing a part of G-pixels with the UV pixel in exchange for decrease of color information to be detected.

The camera module 2 may utilize the information of ultraviolet light for photographing of an object at near distance to obtain large depth of field. Conventionally, there is a case that a fixed focus lens for extended depth of field (EDoF) is used to obtain large depth of field. A peak of a modulation transfer function (MTF) of a component having longer wavelength is at the farther distance side. At near distance, since R-light is far from the MTF peak among respective color light of RGB, the R-component is more likely to be out of focus. Further, between far distance and infinite distance, since B-light is far from the MTF peak among respective color light of RGB, the B-component is more likely to be out of focus.

Since the depth of field is largely ensured, an EDoF fixed focus camera has a lower MTG peak compared to an auto focus camera. The EDoF fixed focus camera performs contour enhancement relatively stronger by the amount of low MTF peak. Blurring of the R-component at near distance and blurring of the B-component between far distance and infinite distance may cause deterioration of image quality as being fomented by the contour enhancement.

With the camera module 2, it is possible to eliminate necessity to make large difference of the MTF peak among the respective color light of RGB by utilizing the information of ultraviolet light for near distance photographing. Accordingly, the camera module 2 can suppress deterioration of image quality while enabling to perform normal photographing and near distance photographing such as bar-code reading and character recognition owing to ensuring of large depth of field.

Since the unnecessary absorption components can be effectively eliminated as being similar to the first embodiment, the image sensor according to the fifth embodiment can suppress worsening of color reproducibility.

FIG. 17 is a schematic perspective view of a camera module according to a modified example of the fifth embodiment. A camera module 60 according to the present modified example is applied to an electronic device such as the digital camera 1 (see FIG. 3).

The camera module 60 includes an image sensor 61 and four pieces of imaging lenses 53. The same numeral is given to the same part as the fourth embodiment and duplicative description is skipped.

Figure 18:
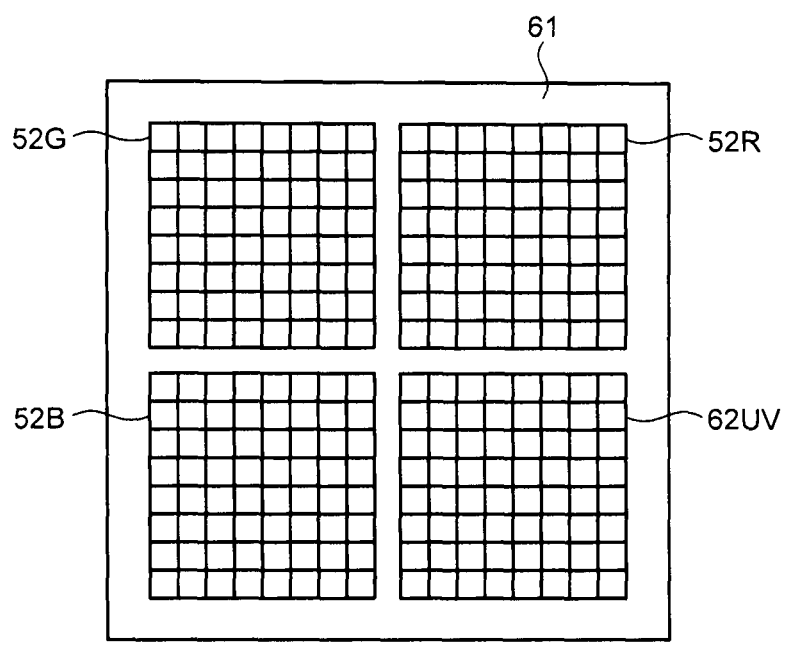
FIG. 18 is a schematic top view of an image sensor.

FIG. 18 is a schematic top view of the image sensor. The image sensor 61 includes the R-pixel array 52R, the B-pixel array 52B, the G-pixel array 52G and an UV-pixel array 62UV. Here, in the drawing, only light-receiving surfaces of the respective pixel arrays 52R, 52B, 52G and 62UV are illustrated while skipping the rest of the structure.

The UV-pixel array 62UV is a pixel array in which pixel cells for ultraviolet light are arranged. The UV-pixel array 62UV includes the UV-pixel cells arranged as being array-shaped.

The R-pixel array 52R, the B-pixel array 52B, the G-pixel array 52G and the UV-pixel array 62UV form a matrix of two rows and two columns in the image sensor 61. The imaging lenses 53 are arranged as corresponding respectively to the R-pixel array 52R, the B-pixel array 52B, the G-pixel array 52G and the UV-pixel array 62UV. The camera module 60 can acquire information of ultraviolet light with the UV-pixel array 62UV.

In a case of the present modified example, it is also possible for the camera module 60 to suppress deterioration of image quality while ensuring large depth of field. Similarly to the fourth embodiment, the image sensor 61 can reduce axial chromatic aberration while enabling to achieve improvement of color reproducibility and sensitivity by suppressing crosstalk.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
    a pixel array in which a plurality of pixel cells each having a photoelectric conversion element are arranged as being array-shaped and which detects a signal level of each color light as being shared for each pixel cell;
    an infrared light eliminating portion which eliminates infrared light from light proceeding toward the photoelectric conversion element; and
    a color filter which is arranged for each pixel cell as corresponding to color light to be a detection target of the pixel cell and which transmits the color light to be the detection target selectively among light proceeding toward the photoelectric conversion element;
    wherein the infrared light eliminating portion is arranged for each pixel cell and has a selection wavelength set in accordance with the color light to be a detection target of the pixel cell, and
    the infrared light eliminating portion has a wavelength characteristic to block light in a wavelength range where spectral transmittance of the color filter is increased with wavelength lengthening among a range at the side where wavelength is longer than the wavelength having the maximum spectral transmittance of the color filter for color light to be the detection target.

2. The solid-state imaging device according to claim 1, wherein the infrared light eliminating portion is formed integrally with the color filter.

3. The solid-state imaging device according to claim 2, further comprising a photonic color filter which integrates the infrared light eliminating portion and the color filter.

4. The solid-state imaging device according to claim 1, further comprising a micro lens which collects light proceeding toward the photoelectric conversion element;
    wherein the infrared light eliminating portion is disposed into a light path between the micro lens and the photoelectric conversion element.

5. The solid-state imaging device according to claim 1, wherein the infrared light eliminating portion is structured by utilizing inorganic material.

6. The solid-state imaging device according to claim 3, wherein the photonic color filter is structured by utilizing inorganic material.

7. The solid-state imaging device according to claim 1, wherein the pixel array has the pixel cells for each color light arranged in accordance with color arrangement.

8. The solid-state imaging device according to claim 1,
    wherein the plurality of pixel cells include pixel cells for visible light to detect signal levels of respective color light being visible light in a shared manner and a pixel cell for infrared light to detect infrared light; and
    the infrared light eliminating portion is arranged for each pixel cell for visible light and has selection wavelength being set in accordance with color light to be a detection target of the pixel cell for visible light.

9. The solid-state imaging device according to claim 8, wherein the pixel array further comprising:
    a first sub-pixel array for each color in which the pixel cell for visible light is arranged for each color component; and
    a second sub-pixel array for infrared light in which the pixel cell for infrared light is arranged.

10. The solid-state imaging device according to claim 1,
    wherein the plurality of pixel cells include pixel cells for visible light to detect signal levels of respective color light being visible light in a shared manner and a pixel cell for ultraviolet light to detect ultraviolet light; and
    the infrared light eliminating portion is arranged for each pixel cell for visible light and has selection wavelength being set in accordance with color light to be a detection target of the pixel cell for visible light.

11. The solid-state imaging device according to claim 10, wherein the pixel array further comprising:
    a first sub-pixel array for each color in which the pixel cell for visible light is arranged for each color component; and
    a second sub-pixel array for ultraviolet light in which the pixel cell for ultraviolet light is arranged.

* * * * *